United States Patent
Smakman et al.

(10) Patent No.: US 11,243,179 B2
(45) Date of Patent: Feb. 8, 2022

(54) INSPECTION TOOL, LITHOGRAPHIC APPARATUS, ELECTRON BEAM SOURCE AND AN INSPECTION METHOD

(71) Applicant: ASML NETHERLANDS B.V., Veldhoven (NL)

(72) Inventors: Erwin Paul Smakman, Eindhoven (NL); Albertus Victor Gerardus Mangnus, Eindhoven (NL); Thomas Jarik Huisman, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/652,231

(22) PCT Filed: Oct. 1, 2018

(86) PCT No.: PCT/EP2018/076639
§ 371 (c)(1),
(2) Date: Mar. 30, 2020

(87) PCT Pub. No.: WO2019/081162
PCT Pub. Date: May 2, 2019

(65) Prior Publication Data
US 2020/0249181 A1  Aug. 6, 2020

(30) Foreign Application Priority Data
Oct. 25, 2017 (EP) .................... 17198202

(51) Int. Cl.
*G01N 23/2251* (2018.01)
*G01B 15/00* (2006.01)
(Continued)

(52) U.S. Cl.
CPC ......... *G01N 23/2251* (2013.01); *G01B 15/00* (2013.01); *G03F 7/70716* (2013.01);
(Continued)

(58) Field of Classification Search
CPC ............ G01N 23/2251; G01N 23/225; G01N 23/251; G01N 2223/6116; G01B 15/00;
(Continued)

(56) References Cited

U.S. PATENT DOCUMENTS 5,612,535 A   3/1997  Wang
6,566,655 B1  5/2003  Choo et al.
(Continued)

FOREIGN PATENT DOCUMENTS

CN  101075015  11/2007
DE  1922821    11/1970
(Continued)

OTHER PUBLICATIONS

Japanese Office Action issued in corresponding Japanese Patent application No. 2020-514189, dated Apr. 5, 2021.
(Continued)

*Primary Examiner* — Jason L McCormack
(74) *Attorney, Agent, or Firm* — Pillsbury Winthrop Shaw Pittman LLP (57) ABSTRACT

An inspection method for a substrate, the inspection method including: providing an electron beam having a first polarization state to a sample of the semiconductor substrate; detecting a first response signal of the sample caused by interaction of the electron beam having the first polarization state with the sample; providing an electron beam having a second polarization state to the sample of the semiconductor substrate; detecting a second response signal of the sample caused by interaction of the electron beam having the second polarization state with the sample; and determining a geometric or material property of the sample, based on the first response signal and the second response signal.

20 Claims, 8 Drawing Sheets

(51) Int. Cl.
*G03F 7/20* (2006.01)
*H01J 37/065* (2006.01)
*H01J 37/073* (2006.01)
*H01J 37/22* (2006.01)
*H01J 37/28* (2006.01)

(52) U.S. Cl.
CPC .......... *H01J 37/065* (2013.01); *H01J 37/073* (2013.01); *H01J 37/222* (2013.01); *H01J 37/28* (2013.01); *G01B 2210/56* (2013.01); *G01N 2223/6116* (2013.01); *H01J 2237/06316* (2013.01); *H01J 2237/24557* (2013.01); *H01J 2237/2814* (2013.01); *H01J 2237/2817* (2013.01)

(58) Field of Classification Search
CPC ............. G01B 2210/56; G03F 7/70716; G03F 7/70616; H01J 37/00; H01J 37/02; H01J 37/065; H01J 37/07; H01J 37/073; H01J 37/222; H01J 37/28; H01J 2237/06316; H01J 2237/24557; H01J 2237/2814; H01J 2237/2817
USPC .......................................... 250/306, 307, 311
See application file for complete search history.

(56) References Cited

U.S. PATENT DOCUMENTS

| | | | |
|---|---|---|---|
| 6,590,210 B1* | 7/2003 | Essers | H01J 37/244 250/397 |
| 2006/0133661 A1 | 6/2006 | Takeda et al. | |
| 2007/0146657 A1 | 6/2007 | Mierlo et al. | |
| 2007/0215802 A1* | 9/2007 | Ward | H01J 37/28 250/309 |
| 2008/0073554 A1 | 3/2008 | Duan et al. | |
| 2010/0127170 A1 | 5/2010 | Fujita et al. | |
| 2010/0127255 A1* | 5/2010 | Allen | H01L 29/22 257/43 |
| 2011/0246142 A1* | 10/2011 | Li | G01B 11/24 703/2 |
| 2012/0248959 A1* | 10/2012 | Buehler | H01J 3/02 313/13 |
| 2016/0116849 A1 | 4/2016 | Cramer et al. | |
| 2017/0231079 A1* | 8/2017 | Mabuchi | H05H 3/02 |
| 2018/0283853 A1* | 10/2018 | Pandey | G01B 11/2513 |

FOREIGN PATENT DOCUMENTS

| | | |
|---|---|---|
| EP | 0348239 | 12/1989 |
| JP | H01320750 | 12/1989 |
| JP | 2006170907 | 6/2006 |
| JP | 2009541966 | 11/2009 |
| JP | 2014127224 | 7/2014 |
| JP | 2016523378 | 8/2016 |
| JP | 2017004774 | 1/2017 |
| TW | I429899 | 2/2010 |

OTHER PUBLICATIONS

International Search Report and Written Opinion issued in corresponding PCT Patent Application No. PCT/EP2018/076639, dated Jan. 7, 2019.
European Search Report issued in corresponding European Patent Application No. EP17198202, dated Apr. 26, 2018.

* cited by examiner

INSPECTION TOOL, LITHOGRAPHIC APPARATUS, ELECTRON BEAM SOURCE AND AN INSPECTION METHOD

CROSS-REFERENCE TO RELATED APPLICATIONS

This application is the U.S. national phase entry of PCT Patent Application No. PCT/EP2018/076639, which was filed on Oct. 1, 2018, which claims the benefit of priority of European Patent Application No. 17198202.8 which was filed on Oct. 25, 2017 and which is incorporated herein in its entirety by reference.

BACKGROUND

Field of the Invention

The present invention relates to an inspection tool, a lithographic apparatus, an electron beam source and an inspection method.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The radiation beam as typically applied in lithographic apparatuses may e.g. be a DUV radiation beam (e.g. having a wavelength of 248 nm or 193 nm) or an EUV radiation beam (e.g. having a wavelength of 11 nm or 13.5 nm).

The manufacturing of an integrated circuit may typically require the stacking of a plurality of layers, whereby the layers need to be accurately aligned. Without such an alignment, a required connection between layers may be flawed, resulting in a malfunctioning of the integrated circuit.

Typically, the bottom layer or layers of the integrated circuit will contain the smallest structures, such as transistors or components thereof. The structures of subsequent layers are typically larger and enable connections of the structures in the bottom layers to the outside world. In view of this, an alignment of two layers will be the most challenging in the bottom portion of the integrated circuit.

In order to ensure that a circuit or a circuit layer is properly patterned, substrates are often subjected to inspection, using inspection tools such as e-beam inspection tools.

An example of such an inspection tool is a high resolution SEM (scanning electron microscope), which is e.g. used to examine dimensions of patterns on a substrate. Such a high resolution SEM typically uses electrons, with an energy between 200 eV and 30 keV, which are accelerated towards the surface of the substrate, where they diffuse into and generate new electrons (i.e. secondary electrons). Due to this, secondary and/or backscattered electrons are emitted from the surface. These secondary and/or backscattered electrons may then be recorded by a detector. By scanning an area of a substrate using a beam of electrons, information about the surface structure of the substrate can be obtained.

It would be desirable to improve the performance of e-beam inspection tools such as high resolution SEMs as currently available.

SUMMARY

It is desirable to improve the performance of e-beam inspection tools.

According to an embodiment of the present invention, there is provided an inspection method for a substrate, the inspection method comprising:
  providing an electron beam having a first polarization state to a sample of the semiconductor substrate;
  detecting a first response signal of the sample caused by interaction of the electron beam having the first polarization state with the sample;
  providing an electron beam having a second polarization state to the sample of the semiconductor substrate;
  detecting a second response signal of the sample caused by interaction of the electron beam having the second polarization state with the sample;
  determining a geometric or material property of the sample, based on the first response signal and the second response signal.

According to an embodiment of the invention, there is provided an inspection tool comprising:
  an e-beam source configured to generate an e-beam having a first polarization state and an e-beam having a second polarization state;
  a beam manipulator configured to direct the electron beam having the first polarization state and the e-beam having the second polarization state onto a sample;
  a detector configured to detect a first response signal of the sample caused by interaction of the electron beam having the first polarization state with the sample and a second response signal of the sample caused by interaction of the electron beam having the second polarization state with the sample;
  a processing unit configured to determine a geometric or material property of the sample, based on the first response signal and the second response signal.

According to an embodiment of the invention, there is provided an electron beam source comprising:
  a tip-shaped Schottky emitter configured to emit an electron beam, whereby the tip-shaped Schottky emitter comprises a metallic coating;
  a magnetic field generator configured to magnetize the metallic coating, thereby in use spin-polarizing the electron beam.

According to an embodiment of the invention, there is provided a lithographic apparatus comprising:
  an illumination system configured to condition a radiation beam;

a support constructed to support a patterning device, the patterning device being capable of imparting the radiation beam with a pattern in its cross-section to form a patterned radiation beam;

a substrate table constructed to hold a substrate; and a projection system configured to project the patterned radiation beam onto a target portion of the substrate, wherein the apparatus further comprises an inspection tool according to the present invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
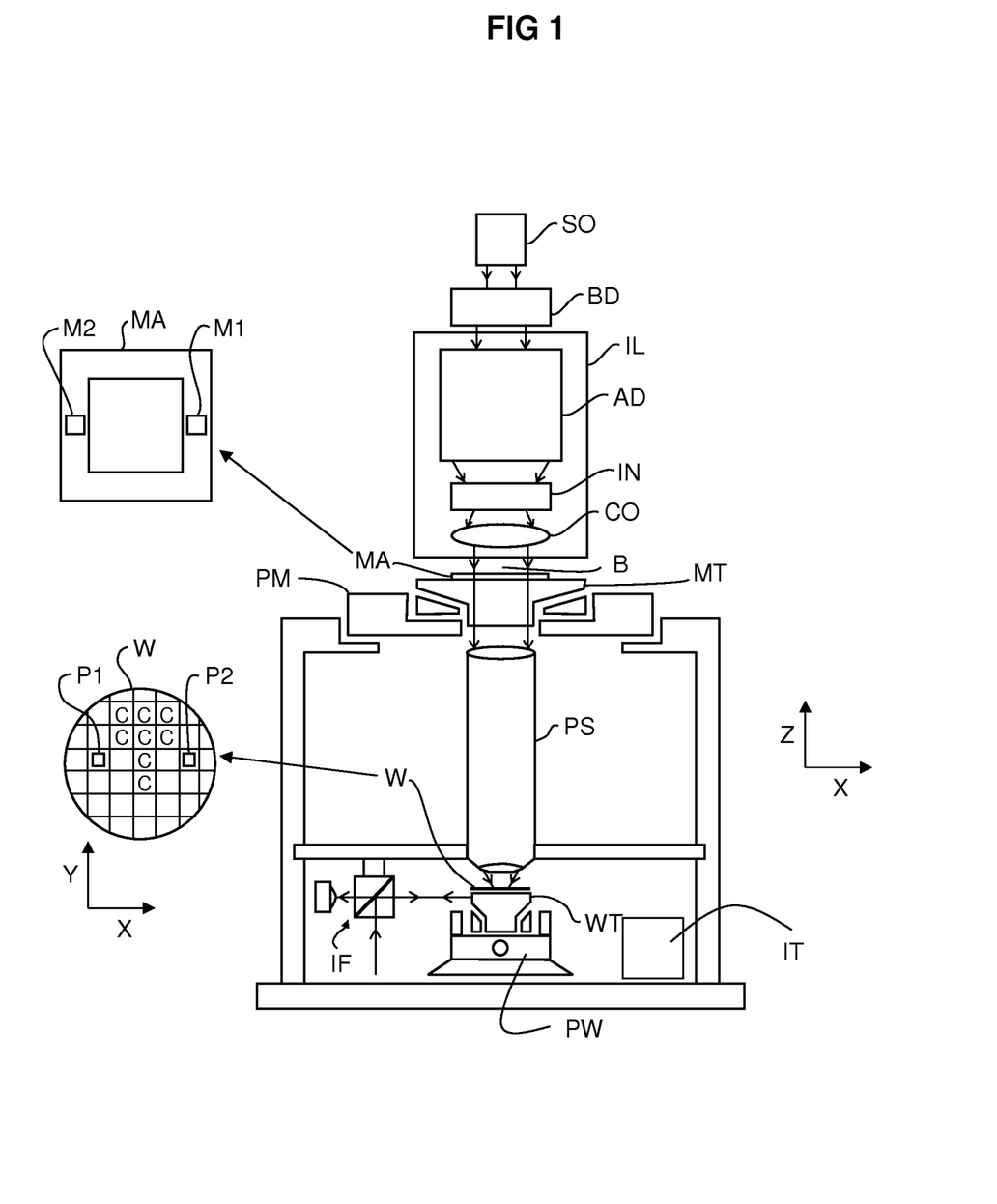
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask)

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioning device PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In the embodiment as shown, the lithographic apparatus further comprises an inspection tool IT according to the invention. Such an inspection tool IT may e.g. enable to determine a characteristic of a structure, in particular a buried structure that is present on or in an area of interest of a substrate W that is processed by the lithographic apparatus. In an embodiment, as will be discussed in more detail below, the inspection tool may comprise an electron beam source for inspecting the substrate.

In an embodiment, the second positioning device PW may be configured to position the substrate W in the operating range of the inspection tool IT. In such an embodiment, the inspection tool IT may e.g. be configured to determine a characteristic of the mentioned structure, e.g. an electric characteristic, a material characteristic and/or a geometric characteristic. In an embodiment, this information may subsequently be provided to a control unit of the lithographic apparatus and used during the exposure process, e.g. by controlling one or more of the illumination system, the projection system or one of the positioning devices, based on the information.

In the embodiment as shown, the lithographic apparatus may be configured to apply DUV radiation for the radiation beam. In such case, the patterning device MA may be a transmissive patterning device and the projection system PS may comprise one or more lenses.

Alternatively, the lithographic apparatus according to the present invention may be configured to apply EUV radiation for the radiation beam. In such case, the patterning device MA may be a reflective patterning device and the projection system PS may comprise one or more mirrors. In such embodiment, the apparatus may comprise one or more vacuum chambers for housing the illumination system IL and/or the projection system PS.

In accordance with an aspect of the present invention, the lithographic apparatus may comprise an inspection tool according to the present invention, in order to perform an inline or offline inspection of a substrate that is to be processed or has been processed.

Figure 2:
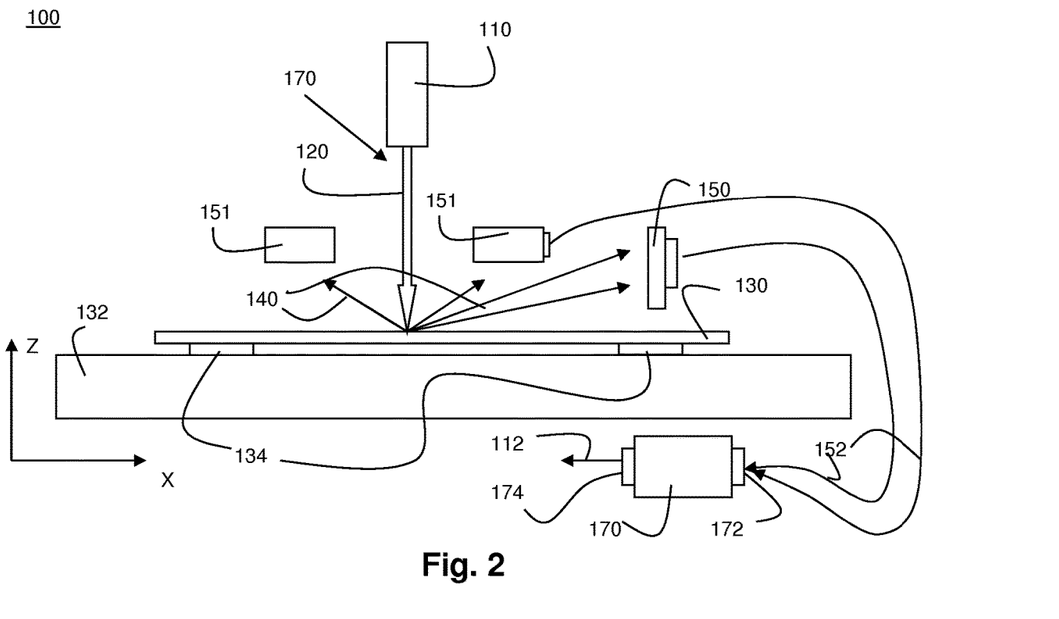
FIG. 2 depicts an inspection tool according to an embodiment of the invention.

According to an aspect of the invention, there is provided an inspection tool configured to inspect an object such as a semiconductor substrate. FIG. 2 schematically shows an embodiment of such an inspection tool 100. In accordance with the present invention, the inspection tool 100 comprises an electron beam source 110, further on also referred to as an e-beam source 110. Such an e-beam source 110 is known in general, and may be applied in the present invention to project an electron beam 120 onto an area of an object 130, e.g. a substrate. In the embodiment as shown, the object 130 is mounted to an object table 132 by means of a clamping mechanism 134, e.g. a vacuum clamp or an electrostatic clamp. The area of the object onto which the e-beam is projected may also be referred to as sample. Such an e-beam source 110 may e.g. be used to generate an electron beam 120 having an energy ranging from 0.2 keV to 100 keV. An e-beam source 110 may typically have one or more lenses for focusing the electron beam 120 onto a spot of about 0.4 to 5 nm in diameter. In an embodiment, the e-beam source 110 may further comprise one or more scanning coils or deflector plates which may deflect the electron beam 120. By doing so, the electron beam 120 may e.g. be deflected along an X-axis and an Y-axis (perpendicular to the X-axis and the Z-axis), the XY-plane being parallel to a surface of the object, such that an area of the object can be scanned.

In an embodiment of the present invention, the electron beam source is configured to project a plurality of electron beams onto a respective plurality of sub-areas of the area of interest. By doing so, the area of interest that can be examined or inspected per unit of time may be enlarged. Further, in an embodiment of the present invention, the electron beam source may be configured to generate electron beams having a different energy level. As will be explained in more detail below, depending on the applied energy level for the e-beam or beams, different portions or a structure, e.g. a buried structure, may be examined.

When such an e-beam 120 impinges on the surface, interactions on the surface and interactions with the material below the surface will occur, resulting in the exposed surface emitting both radiation and electrons. Typically, when an electron beam 120 interacts with a sample, the electrons constituting the beam will loose energy through scattering and absorption, within a teardrop-shaped volume, known as the interaction volume. The energy exchange between the electron beam and the sample will typically result in a combination of:

an emission of secondary electrons by inelastic scattering,
an emission of electrons that are reflected or back-scattered out of the interaction volume by elastic scattering interactions with the sample,
X-ray emission, and
an emission of electromagnetic radiation, e.g. in a range from deep UV to IR.

The latter emission of electromagnetic radiation is generally referred to as cathodoluminescent light or CL-light.

In an embodiment of the present invention, the inspection tool 100 further comprises a detector 150 for detection of secondary electrons and a detector 151 for back-scattering electrons as emitted by a sample. In FIG. 2, the arrows 140 are indicative for the emitted secondary or back-scattering electrons.

In the embodiment as shown, the inspection tool further comprises a control unit 170 or processing unit, e.g. comprising a microprocessor, computer or the like, for processing the emitted secondary or back-scattering electrons as detected by the detectors 150 and 151.

In an embodiment, the control unit 170 comprises an input terminal 172 for receiving signals 152 from the detectors 150, 151, the signals 152 representing the detected emitted secondary or back-scattering electrons.

In an embodiment, the control unit may further have an output terminal 174 for outputting a control signal 112 for controlling the e-beam source 110. In an embodiment, the control unit 170 may control the e-beam source 110 to project an e-beam 120 onto an area of interest of the object to be inspected, e.g. a semiconductor substrate.

In an embodiment, the control unit 170 may be configured to control the e-beam source 110 to scan the area of interest.

During such scanning of an area of interest of an object, the detector may receive secondary or back-scattering electrons 140 from different portions of the area of interest. As an example, the applied e-beam may e.g. have a cross-section of 1-4 nm in diameter, while the area of interest is 100 nm×100 nm. As such, when the area of interest has been scanned, a response to the e-beam across the area of interest may have been captured by detectors 150, 151, where the detected signal is comprised of detected electrons per illuminated pixel. The pixel size may be e.g. be smaller or larger than the cross-section of the e-beam.

Figure 3:
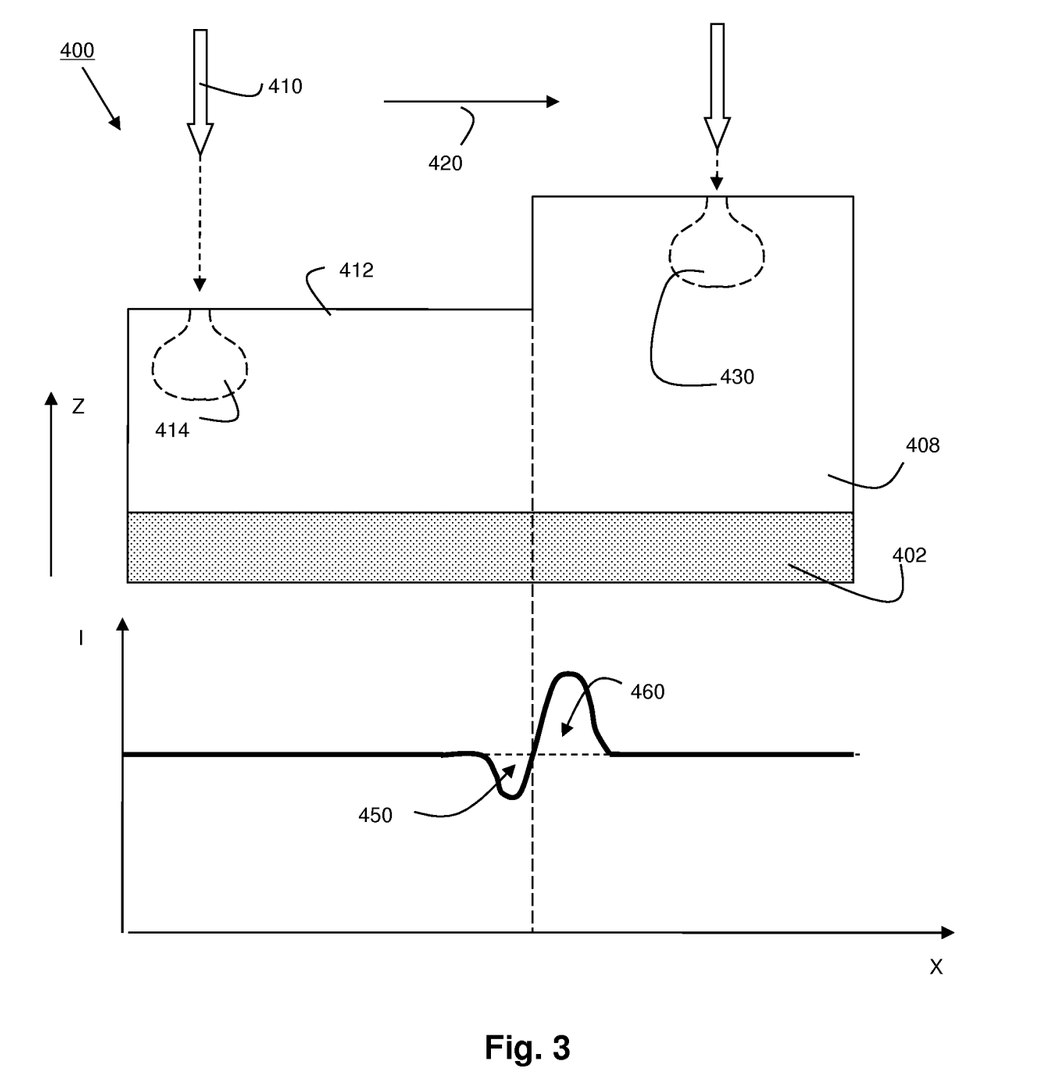
FIG. 3 schematically depicts a cross-sectional view of a structure that can be examined using an inspection tool according to the present invention.
Figure 4:
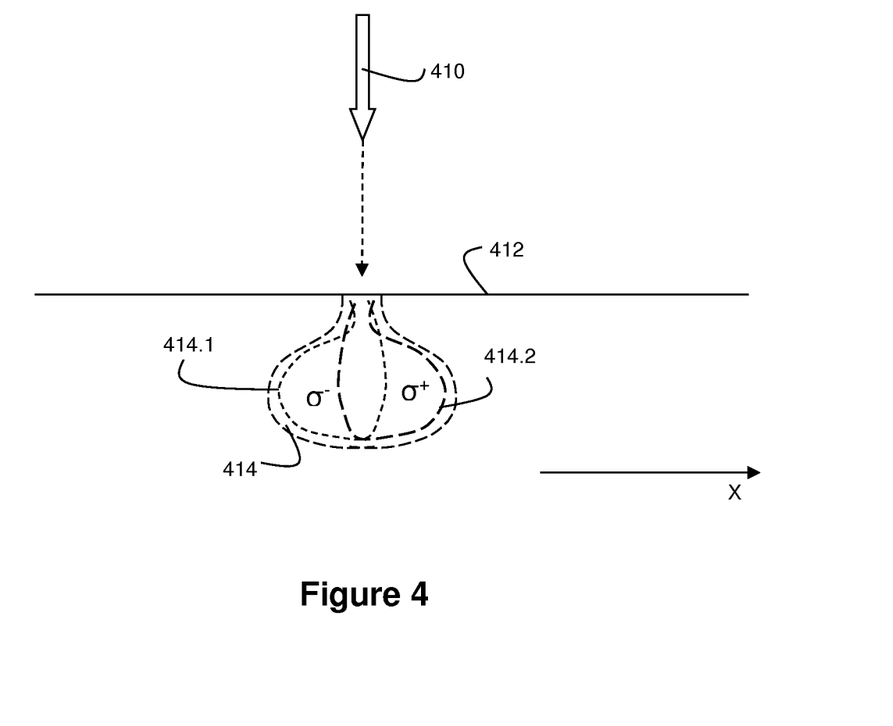
FIGS. 4 and 5 schematically depict cross-sectional views of interaction volumes of different electron beams.

FIG. 3 highly schematically shows a cross-sectional view of a semiconductor structure 400 comprising multiple layers and different materials. The structure 400 as schematically shown in FIG. 3 comprises a bottom layer 402 of a first material, and a top layer 408 of a second material, the second layer having a change in topology, in particular an increased height, when propagating along the X-direction. FIG. 3 further schematically shows an e-beam 410 impinging on the top surface 412 of the structure 400. Indicated by the dotted line 414 is the interaction volume of the e-beam 410, i.e. the volume where secondary or back-scattering electrons may be generated as a result of the applied e-beam. It can be noted that, while the e-beam may have a diameter of only a few nm, the interaction volume will typically have a larger diameter, e.g. 10-1000 nm, depending on the material properties and landing energy. FIG. 4 further illustrates the scanning of the e-beam (indicated by arrow 420) towards the right, thereby moving the interaction volume 414 along the X-axis. During said scanning, the interaction volume 414 will follow the surface 412 of the sample. As such, during such scanning movement, the interaction volume 414 will be affected by the change in topography, i.e. the height step occurring at position $x=x_0$. As a result, the amount of secondary and/or back-scattering electrons as detected will be affected as well. The bottom portion of FIG. 3 schematically shows a detector signal I as detected during a scan of the electron beam 410 along the X-direction. As can be seen, when the e-beam 410 is close to the height step, a decrease 450 occurs in the detector signal I, whereas, when the e-beam 410 has passed the height step, a brief increase 460 occurs. As will be appreciated by the skilled person, the occurrence of such a variation of the detector signal I may thus be used to determine a position of a height step in a layer of a sample.

In accordance with an embodiment of the present invention, it is proposed to apply a spin-polarized electron beam for the inspection of a semiconductor sample. It is proposed to spin-polarize the electron beam, by using the intrinsic magnetic moment of electrons, and applying such an e-beam to inspect a sample. It is believed, as will be explained in more detail below, that such an approach may result in several improvements of known SEM-based inspection tools, such as high resolution SEMs. In particular, it is expected that the following improvements can be realised:

Providing a higher spatial resolution,

Tuning and enhancing the sensitivity to geometrical features as desired by the operator, Increasing the throughput of the SEM by an improved signal-to-noise ratio.

In known high resolution SEM metrology, electrons are used to scan a surface, while the resulting emitted secondary and/or backscatter electrons are recorded in order to reconstruct an image of the surface. The spin of the incident electrons is randomly oriented and typically not discussed as a factor that impacts the image forming of a SEM. However, based on simulations describing high resolution SEM interactions with a sample of interest, one can derive that electrons having a different electron spin will scatter spatially/angularly in a different manner in a sample that is subject to an e-beam, due to spin-orbit interaction with the sample of interest, which is a material-dependent property. This is schematically illustrated in FIG. 4. FIG. 4 schematically shows the interaction volume 414 as generated by an unpolarized e-beam 410 when impacting a surface 412. As schematically illustrated in FIG. 4, the interaction volume 414 can be considered to be the result of a first interaction volume 414.1 which is primarily occupied with electrons having a negative spin polarization, indicated as σ⁻, and a second interaction volume 414.2 which is primarily occupied with electrons having a positive spin polarization, indicated as σ⁺. Phrased differently, depending on their spin, electrons of the e-beam 400, will occupy or scatter to different positions.

When using this property of spin-polarized electrons, it should thus be possible to reshape the volume in which these electrons interact with the material. In particular, in case a spin-polarized beam is applied as a scanning electron beam in a SEM, it is believed that the interaction volume, i.e. the volume which determines the signals measured by SEM is reshaped into an interaction volume that is no longer symmetrical with respect to the electron beam.

Figure 5:
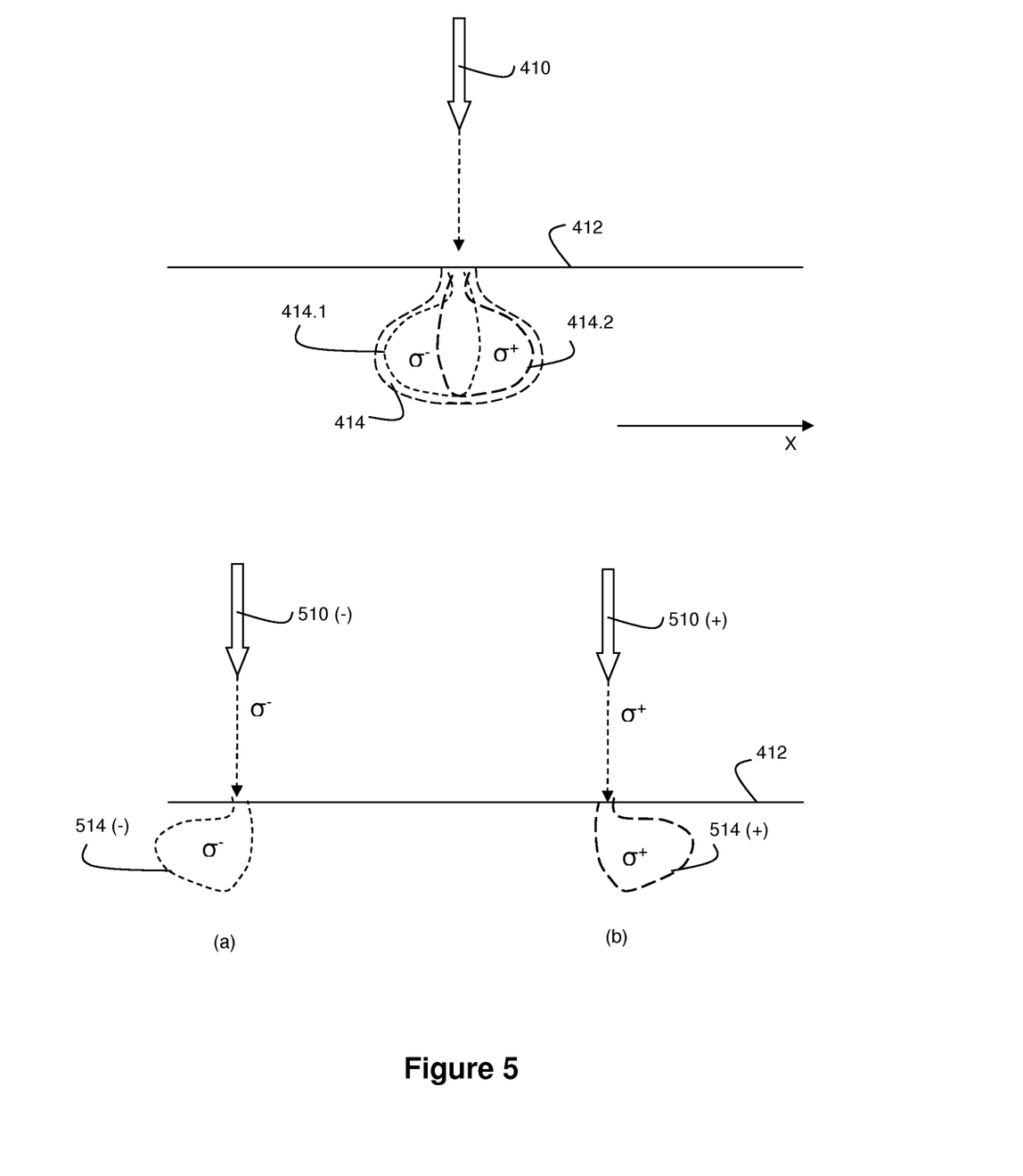

This is schematically illustrated in FIG. 5. FIG. 5 (a), left side of the figure, illustrated the interaction volume 514 (−) underneath a surface 412 when an electron beam 510 (−), an electron beam with a negative spin polarization σ⁻, impacts the surface 412, whereas FIG. 5 (b), right side of the figure, illustrated the interaction volume 514 (+) underneath a surface 412 when an electron beam 510 (+), an electron beam with a positive spin polarization σ⁺, impacts the surface 412. As can be seen, by controlling the spin-polarization of the incident electrons, their interaction volume can be controlled. The inventors believe that the spin-orbit coupling results in spin-selective scattering, which introduces the asymmetry in the interaction volume. This asymmetric interaction volume may enable an increase in the spatial resolution in the following ways:

The overall interaction volume may become slightly narrower, hence reducing the electron spreading.

Near an edge the contrast in the signal can be altered and possibly improved, as is discussed in more detail below. This improved contrast may improve the position determination of the edge in the signal.

In an embodiment of the present invention, use is made of this property to more accurately determine geometric or material characteristics of a sample that is being examined. In particular, in an embodiment of the present invention, an inspection method for a substrate is proposed, the inspection method comprising the following steps:

providing an electron beam having a polarized state to a sample of the substrate;

detecting a response signal of the sample caused by interaction of the electron beam having the polarized state with the sample;

determining a geometric property of the sample, based on the response signal.

In such embodiment, a polarized state of an electron beam refers to the electron beam being spin-polarized to a certain degree. The degree of spin-polarization p of an e-beam may e.g. be defined as:

$$p = \frac{n^+ - n^-}{n},$$

whereby n⁺=the number of positive spin-polarized electrons;

n⁻=the number of negative spin-polarized electrons;

n=the total number of electrons=n⁺+n⁻

In an embodiment of the present invention, the electron beam as applied to inspect the sample has a degree of spin-polarization p of at least 10%. In a preferred embodiment, the degree of spin-polarization of the applied electron beam is 30-50%. As illustrated above, when using an electron beam having a polarized state, the interaction volume is reduced in size. In particular, when comparing the interaction volume 414 of the unpolarized beam 414 of FIG. 4 with the interaction volume 414.1 or 414.2, one can observe that the width of the interaction volume, i.e. the size of the interaction volume in the X-direction, of a spin-polarized beam is smaller that the width of the interaction volume of an unpolarized beam. As a result, when a sample is inspected with a spin-polarized e-beam, it can be inspected with an improved spatial resolution, due to the smaller interaction volume applied.

In an embodiment, the inspection method can e.g. be applied to determine geometric properties such as dimensions of structures on the surface of the substrate. As an example, a line width of a structure may e.g. be determined in this manner, with an improved resolution. In such embodiment, geometric features of structures on a semiconductor substrate may be determined.

In an embodiment of the present invention, the inspection method is in particular applied to a semiconductor substrate for the inspection of structures on the surface of such a semiconductor substrate. Using the method according to the present invention, both geometric features or characteristics and material characteristics or properties may be examined.

In yet another embodiment of the present invention, an inspection method is provided that applies at least two consecutive electron beams to a sample that is to be inspected, whereby the two electron beams have a different polarization state. Such an inspection method may e.g. comprise the following steps:

providing an electron beam having a first polarization state to a sample of e.g. a substrate;

detecting a first response signal of the sample caused by interaction of the electron beam having the first polarization state with the sample;

providing an electron beam having a second polarization state to the sample of the semiconductor substrate;

detecting a second response signal of the sample caused by interaction of the electron beam having the second polarization state with the sample;

determining a geometric or material property of the sample, based on the first response signal and the second response signal.

Figure 6:
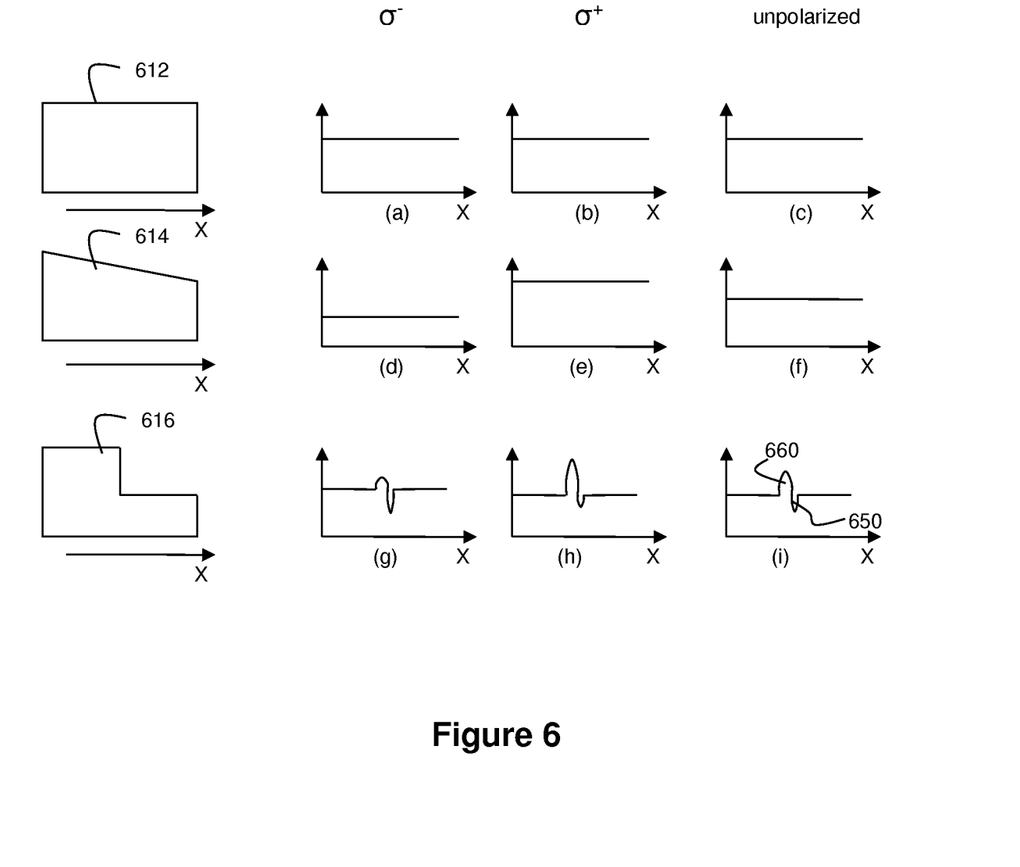
FIG. 6 schematically depicts detector signals of different electron beams when inspecting different geometric features.

Using such an inspection method, more detailed geometric or material properties of a sample can be explored. This is schematically illustrated in FIG. 6. FIG. 6 schematically illustrates the scanning by an electron beam of three different geometric structures, whereby these structures are scanned by an electron beam with a negative spin-polarization, indicated as σ⁻, an electron beam with a positive spin-polarization, indicated as σ⁺, and an electron beam with a unpolarized state, indicated as 'unpolarized'. Graphs (a) to (i) illustrate a detector signal as can be obtained when the different geometric structures as scanned using the three different electron beams.

In particular, graphs (a) to (c) illustrate a detector signal that can be obtained when a substantially horizontal surface 612 is scanned. Graphs (d) to (f) illustrate a detector signal that can be obtained when a slanted or sloped surface 614 is scanned. Graphs (g) to (i) illustrate a detector signal that can be obtained when surface 616 with a height step, in particular a decrease in height, is scanned.

With respect to the scanning of the substantially horizontal surface 612, it can be seen that the detector signal as obtained using the three different electron beams, i.e. σ⁻, σ⁺, and 'unpolarized', result in substantially similar detector signals. Note the detector signals may e.g. be normalised to take account of differences in intensities of the applied electron beams.

With respect to the scanning of the slanted surface 614, it can be seen that the detector signal as obtained using the three different electron beams, i.e. σ⁻, σ⁺, and 'unpolarized', result in different detector signals. This can be attributed to the fact that the three different electron beams scan the surface with different interaction volumes, as illustrated in FIGS. 4 and 5.

As such, by comparing any two signals from the three different electron beams as applied, one can make the assessment that the surface 614 that is scanned has a slope. In the arrangement as shown, the surface 614 can be considered to have a negative slope. Such a negative slope results in a comparatively small detector signal when the surface is scanned with the electron beam with the negative spin-polarization, indicated as σ⁻. This can be explained when considering that back-scattering and secondary electrons that are generated in the interaction volume of an electron beam with a negative spin-polarization, e.g. volume 514 (−) as shown in FIG. 5, are more remote from the surface 614 than back-scattering and secondary electrons that are generated in the interaction volume of an electron beam with a positive spin-polarization, e.g. volume 514 (+) as shown in FIG. 5. Or, depending on the spin-polarization of the incident electrons, the electrons may on average be closer or further away from the tilted surface. As a result, the detector signal obtained by the negative spin-polarized electron beam will be lower than the detector signal obtained by the positive spin-polarized electron beam or by the unpolarized electron beam. As such, based on any combination of two of the signals as shown in graphs (d) to (f) in FIG. 6, one may determine that the surface that is scanned, is slanted. It may also be mentioned that, the steeper the slope of the slanted surface, the larger the difference between the detector signals generated by the three different electron beams, i.e. σ⁻, σ⁻, and 'unpolarized', will be. As such, while in a conventional high resolution SEM it is difficult or maybe even impossible to distinguish an ideal flat surface from a slanted or tilted surface due to gain settings of the detector, the present invention enables to make such a distinction by inspecting the surface with at least two electron beams with a different polarization state. Using an embodiment of the present invention, both the direction and magnitude of the slope may be identified.

Graphs (g) to (i) illustrate a detector signal that can be obtained when surface 616 with a height step is scanned. As can be seen, such a height step also affects the detector signal of the three different electron beams, i.e. σ⁻, σ⁻, and 'unpolarized', in a different manner. In case a negative height step is scanned by an electron beam, a brief increase or peak 660 in the detector signal can be observed when scanning close to the height step, whereas, when the e-beam has passed the negative height step, a brief decrease or dip 650 may occur. By using a spin-polarized electron beam, both the peak 660 and the dip 650 can be affected, due to asymmetric interaction volume that may occur in such circumstances. As can be observed from the graphs (g) and (h), the brief dip 660 occurring when the electron beam approaches the height step will be smaller when a negative spin-polarized electron beam is applied and will be larger when a positive spin-polarized electron beam is applied. As such, in accordance with the present invention, the use of a spin-polarized electron beam enable to control the shape of the interaction volume depending on the spin-polarization. This allows to modify how a geometry is measured, e.g. by a high resolution SEM. A key geometry for which a high resolution SEM is typically employed, is to observe edges, i.e. height steps, of structures, see the third geometry presented in FIG. 6. As illustrated in graphs (g) to (i) in FIG. 6 and in FIG. 3, the detector signal will show an increase in signal at one side of the edge, while a reduction of the signal may be perceived at the other side of the edge. This effect comes from the fact that the electrons near an edge can not only escape from the top surface, but also from the side of the edge, also called edge blooming. By controlling or reshaping the interaction volume (using a spin-polarized electron beam) such that it interacts with the edge in a limited way (⁻ in FIG. 6), a less pronounced peak and a more pronounced dip in the signal. The opposite holds when using the opposite spin polarization (⁺ in FIG. 6). As such, the sensitivity of the edge can be tuned by tuning the applied degree of spin-polarization, allowing for increasing the sensitivity of CD (critical dimension) measurements. Moreover, by considering the difference between detector signals obtained by using opposite spin-polarizations for an edge structure as e.g. shown in FIG. 3 or FIG. 6, contributions from the flat surface to the signals can be removed. With reference to FIG. 6, one could e.g. determine the difference between graph (g) and graph (h) and process this signal to determine a position of the height step or edge. Such contributions coming from the flat surface would typically be considered background offset or noise. As such, by employing the abovementioned methods, the signal-to-noise ratio of a high resolution SEM can be increased. Alternatively to increasing the resolution or edge sensitivity, this allows for the reduction of measurement time per area. Or in other words, this allows for a throughput increase of the technique.

As discussed above, the present invention provides in an inspection method for inspecting a sample using an electron beam have a polarized state.

According to a further aspect of the present invention, there is provided an inspection tool that is configured to perform the inspection methods according to the present invention.

In an embodiment, an inspection tool according to the present invention may comprise the following components:

an e-beam source configured to generated a spin-polarized e-beam;
a beam manipulator configured to direct the electron beam onto a sample;
a detector configured to detect a response signal of the sample caused by interaction of the electron beam having the polarization state with the sample, and
a processing unit configured to determine a geometric or material property of the sample, based on the response signal.

In an embodiment, the e-beam source as applied may be configured to generate an e-beam having a first polarization state and an e-beam having a second polarization state. Referring to FIG. 6, the first polarization state and the second polarization state may e.g. be any combination of the three polarization states σ⁻, σ⁺, and 'unpolarized' as described.

With respect to the application of a spin-polarized electron beam, it may be pointed out that a spin-polarized electron beam may e.g. be generated by illuminating a GaAs cathode with a circularly polarized infrared laser. As such, in an embodiment of the inspection tool according to the present invention, the inspection tool comprises a spin-polarized electron beam source comprising a GaAs cathode and an IR laser configured to emit a circularly polarized laser beam onto the cathode.

According to an aspect of the present invention, there is provided an alternative electron beam source which can be applied in an inspection tool according to the present invention.

The electron beam source according to the present invention applies a Schottky emitter. In particular, in an embodiment, a standard high resolution SEM Schottky emitter may be applied. A standard Schottky emitter typically consists of a tungsten (W) core with a $ZrO_2$ thin film and operates around 1800 K. At this temperature many high-energy electrons are created that are extracted from the material with an electric acceleration field. The $ZrO_2$ has the special characteristic that it lowers the work function at higher temperatures, which is beneficial for the extraction of electrons and thus for the maximum brightness and current that can be generated. This temperature at the same time slowly melts the $ZrO_2$, which then distributes over the W surface. This is needed because otherwise the $ZrO_2$ would disappear in time from the W core through outgassing, degrading the electron beam source, in particular the Schottky emitter.

In accordance with an aspect of the present invention, a modified Schottky emitter is proposed, the modified Schottky emitter enabling the generation of a spin-polarized electron beam.

In order to enable a Schottky emitter to generate spin-polarized electrons, it is proposed to add a magnetic metallic coating or layer to the emitter. By doing so, the emitted electron beam can be spin-polarized. It can however be noted that there is however no metal that is still ferromagnetic at 1800 K. The highest Curie (transition temperature) is for Co at 1388 K, another candidate would be Fe with a Curie temperature of 1043 K. In order to avoid lowering the operating temperature of the Schottky emitter (and therefore diminishing the output brightness and current), it is proposed to rely on the paramagnetic properties of the materials instead. In order to magnetize the metallic coating or layer that is applied to the emitter, an external magnetic field can be applied. Such external magnetic field can magnetize the metallic layer and can thus create a spin barrier for the electrons that polarizes the electron beam. In a preferred embodiment, Fe is used for the metallic layer, because of its high magnetic susceptibility.

Figure 7:
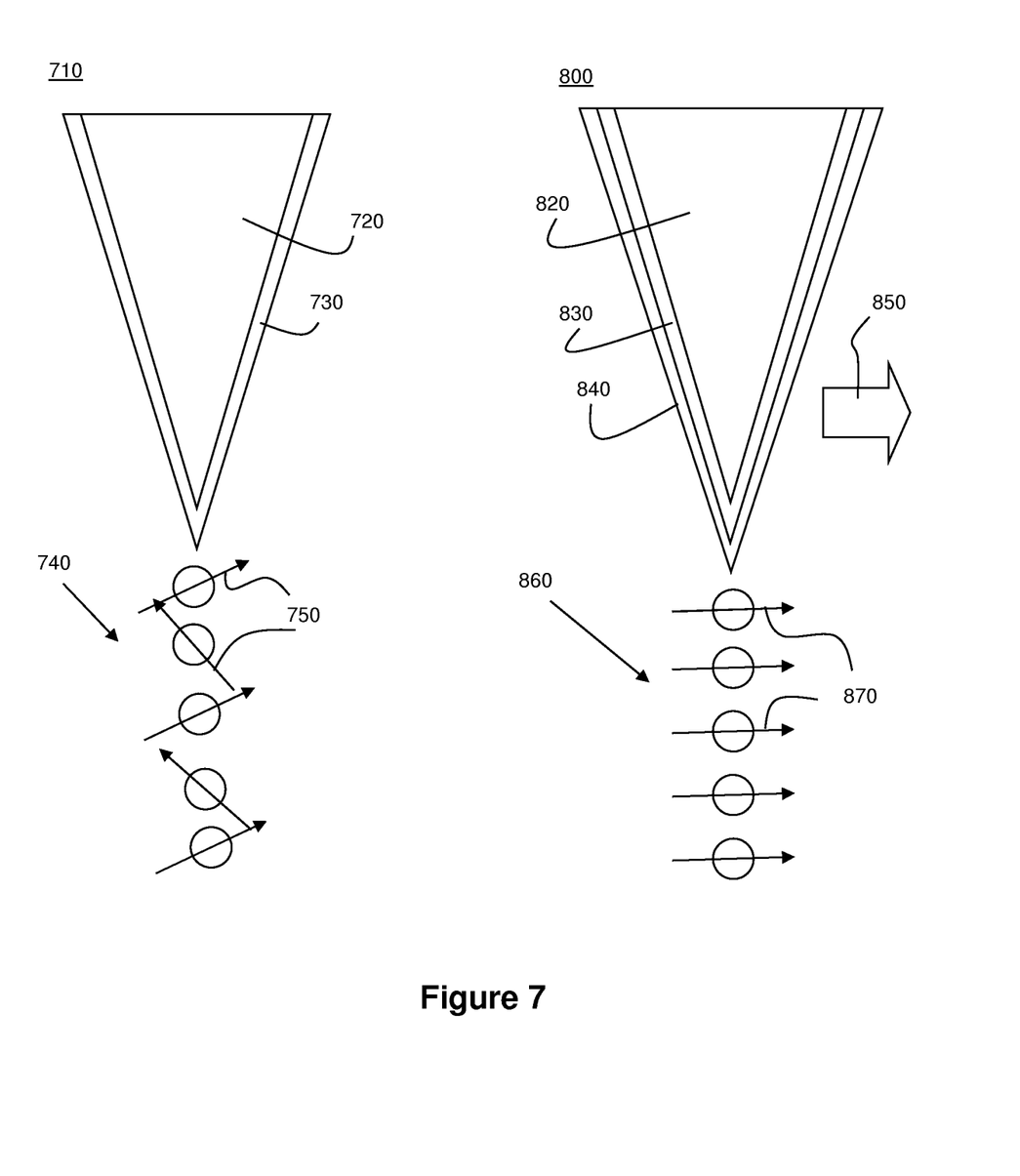
FIG. 7 schematically depicts a Schottky emitter and a modified Schottky emitter.

FIG. 7 schematically shows an embodiment of the modified Schottky emitter which can be used in an inspection tool. On the left in FIG. 7, a conventional Schottky emitter 710 is schematically shown, the emitter 710 having a tip shaped W core 720 provided with a $ZrO_2$ coating 730. During operation, the Schottky emitter 710 may generate an electron beam 740, whereby the polarization of the electrons of the beam, indicated by the arrows 750, have no preferred direction. As such, the generated electron beam 740 can be considered to be unpolarized or in an unpolarized state.

On the right in FIG. 7, a modified Schottky emitter 800 according to an embodiment of the present invention is schematically shown. The modified Schottky emitter 800 has a tip shaped W core 820 provided with a $ZrO_2$ coating 830. The emitter 800 further comprises a metallic coating 840, e.g. an iron or ferrous coating. When, during use, the Schottky emitter 800 is operated in an external magnetic field, indicated by the arrow 850, an electron beam 860 can be generated, which electrons have a preferred polarization, schematically indicated by the arrows 870.

In order to generate the external magnetic field 850, various options exist. In an embodiment, the external magnetic field may be generated by one or more current carrying coils. Such coils may e.g. be arranged in the vicinity of the emitter 800, enabling the magnetization of the metallic layer 840. In an embodiment, the one or more coils may be mounted to a magnetic yoke such as a ferromagnetic yoke, for guiding the magnetic flux to the emitter 800. The use of one or more coils for generating the external magnetic field provided the advantage that the magnetic field strength is easily adjusted. By e.g. reversing the current to the coil or coils, one can reverse the external magnetic field and thus reverse the spin-polarization of the electron beam 860.

As an alternative, or in addition, permanent magnets may also be applied to generate the external magnetic field 850. Such permanent magnets may also be mounted to a magnetic yoke such as a ferromagnetic yoke, for guiding the magnetic flux to the emitter 800. In order to adjust the external magnetic field in such embodiment, the relative position of the permanent magnets and the emitter 800 can be made adjustable, e.g. by means of a positioning device such as an actuator.

Figure 8:
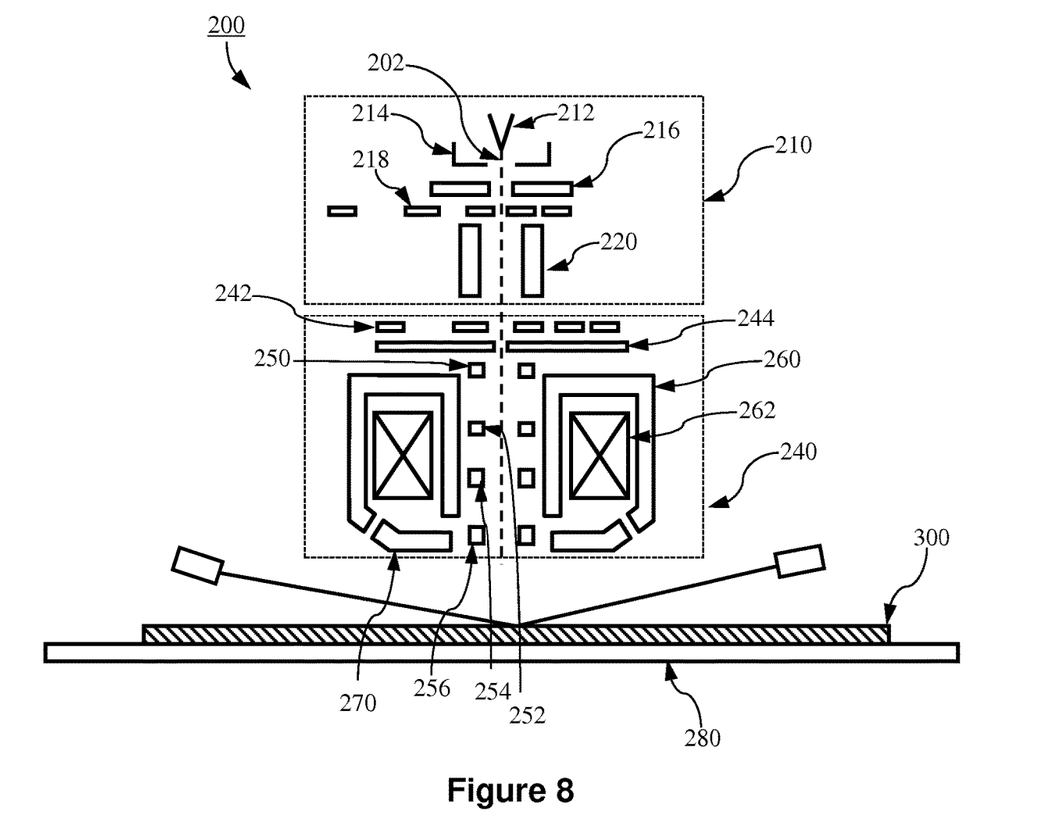
FIG. 8 schematically depicts a cross-sectional view of an inspection tool according to the present invention.

FIG. 8 schematically depict a more detailed embodiment of an inspection tool 200 according to the present invention. The inspection tool 200 comprises an e-beam source, referred to as the electron gun 210 and an imaging system 240.

The electron gun 210 comprises an electron source 212, a suppressor electrode 214, an anode 216, a set of apertures 218, and a condenser 220. The electron source 212 can be a Schottky emitter or modified Schottky emitter as discussed above. By the positive charge of the anode 216, the electron beam 202 can be extracted, and the electron beam 202 may be controlled by using a tunable aperture 218 which may have different aperture sizes for eliminating the unnecessary electron beam outside of the aperture. In order to condense the electron beam 202, the condenser 220 is applied to the electron beam 202, which also provides magnification. The condenser 220 shown in the FIG. 2 may e.g. be an electrostatic lens which can condense the electron beam 202. On the other hand, the condenser 220 can be also a magnetic lens.

The imaging system 240 may e.g. comprise a blanker 248, a set of apertures 242, a detector 244, four sets of deflectors

250, 252, 254, and 256, a pair of coils 262, a yoke 260, and an electrode 270. The electrode 270 is used to retard and deflect the electron beam 202, and further has electrostatic lens function due to the combination of upper pole piece and sample 300. Besides, the coil 262 and the yoke 260 are configured to the magnetic objective lens.

The deflectors 250 and 256 can be applied to scan the electron beam 202 to a large field of view, and the deflectors 252 and 254 can be used for scanning the electron beam 202 to a small field of view. All the deflectors 250, 252, 254, and 256 can control the scanning direction of the electron beam 202. The deflectors 250, 252, 254, and 256 can be electrostatic deflectors or magnetic deflectors. The opening of the yoke 260 is faced to the sample 300, which immerses the magnetic field into the sample 300. On the other hand, the electrode 270 is placed beneath the opening of the yoke 260, and therefore the sample 300 will not be damaged. In order to correct the chromatic aberration of the electron beam 202, the retarder 270, the sample 300, and the upper pole piece form a lens to eliminate the chromatic aberration of the electron beam 202.

The embodiments may further be described using the following clauses:

1. Inspection method for a substrate, the inspection method comprising:
   providing an electron beam having a first polarization state to a sample of the semiconductor substrate;
   detecting a first response signal of the sample caused by interaction of the electron beam having the first polarization state with the sample;
   providing an electron beam having a second polarization state to the sample of the semiconductor substrate;
   detecting a second response signal of the sample caused by interaction of the electron beam having the second polarization state with the sample;
   determining a geometric or material property of the sample, based on the first response signal and the second response signal.
2. The inspection method according to clause 1, wherein the geometric property is a slope of the sample.
3. The inspection method according to clause 1, wherein the geometric property is a topographic property of the sample.
4. The inspection method according to clause 1, wherein the first polarization state is an unpolarized state and the second polarization state is a polarized state.
5. The inspection method according to clause 1, wherein the first polarization state is a polarized state and the second polarization state is a polarized state.
6. The inspection method according to clause 5, wherein the first polarization state is a negative polarized state and the second polarization state is a positive polarized state.
7. The inspection method according to clause 4, 5 or 6, wherein a degree of polarization of the polarized state is at least 10%.
8. Inspection method for a substrate, the inspection method comprising:
   providing an electron beam having a polarized state to a sample of the substrate;
   detecting a response signal of the sample caused by interaction of the electron beam having the polarized state with the sample;
   determining a geometric property of the sample, based on the response signal.
9. The inspection method according to clause 8, wherein the geometric property is a slope of the sample.
10. The inspection method according to clause 8, wherein the geometric property is a topographic property of the sample.
11. The inspection method according to clause 8, 9 or 10, wherein a degree of polarization of the polarized state is at least 10%.
12. Inspection method for a semiconductor substrate, the inspection method comprising:
    providing an electron beam having a polarized state to a sample of the semiconductor substrate;
    detecting a response signal of the sample caused by interaction of the electron beam having the polarized state with the sample;
    determining a geometric or material property of the sample, based on the response signal.
13. The inspection method according to clause 12, wherein a degree of polarization of the polarized state is at least 10%.
14. An inspection tool configured to perform the inspection method according to any of the preceding clauses.
15. Inspection tool comprising:
    an e-beam source configured to generate an e-beam having a first polarization state and an e-beam having a second polarization state;
    a beam manipulator configured to direct the electron beam having the first polarization state and the e-beam having the second polarization state onto a sample;
    a detector configured to detect a first response signal of the sample caused by interaction of the electron beam having the first polarization state with the sample and a second response signal of the sample caused by interaction of the electron beam having the second polarization state with the sample;
    a processing unit configured to determine a geometric or material property of the sample, based on the first response signal and the second response signal.
16. The inspection tool according to clause 15, wherein the e-beam source comprises:
    a tip-shaped Schottky emitter configured to emit an electron beam, whereby the tip-shaped Schottky emitter comprises a metallic coating;
    a magnetic field generator configured to magnetize the metallic coating, thereby in use spin-polarizing the electron beam.
17. The inspection tool according to clause 16, wherein the metallic coating comprises iron.
18. An electron beam source comprising:
    a tip-shaped Schottky emitter configured to emit an electron beam, whereby the tip-shaped Schottky emitter comprises a metallic coating;
    a magnetic field generator configured to magnetize the metallic coating, thereby in use spin-polarizing the electron beam.
19. The electron beam source according to clause 18, wherein the Schottky emitter comprises a tungsten core provided with a $ZrO_2$ coating.
20. A lithographic apparatus comprising:
    an illumination system configured to condition a radiation beam;
    a support constructed to support a patterning device, the patterning device being capable of imparting the radiation beam with a pattern in its cross-section to form a patterned radiation beam;
    a substrate table constructed to hold a substrate; and
    a projection system configured to project the patterned radiation beam onto a target portion of the substrate, wherein the apparatus further comprises an inspection tool according to any of the clause 14-17.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. An inspection method comprising:
    detecting a first response signal of a sample of a semiconductor substrate caused by interaction of an electron beam having a first polarization state with the sample;
    detecting a second response signal of the sample caused by interaction of an electron beam having a second polarization state with the sample; and
    determining a geometric property of the sample, based on a comparison or difference between the first response signal and the second response signal.

2. The inspection method according to claim 1, wherein the geometric property is a slope of the sample.

3. The inspection method according to claim 1, wherein the geometric property is a topographic property of the sample.

4. The inspection method according to claim 1, wherein the first polarization state is an unpolarized state and the second polarization state is a polarized state.

5. The inspection method according to claim 1, wherein the first polarization state is a polarized state and the second polarization state is a polarized state.

6. The inspection method according to claim 5, wherein the first polarization state is a negative polarized state and the second polarization state is a positive polarized state.

7. The inspection method according to claim 4, wherein a degree of polarization of the polarized state is at least 10%.

8. An inspection tool comprising:
    an e-beam source configured to generate an e-beam having a first polarization state and an e-beam having a second polarization state;
    a beam manipulator configured to direct the electron beam having the first polarization state and the e-beam having the second polarization state onto a sample;
    a detector configured to detect a first response signal caused by interaction of the electron beam having the first polarization state with the sample and a second response signal caused by interaction of the electron beam having the second polarization state with the sample; and
    a processing unit configured to determine a geometric property of the sample, based on a comparison or difference between the first response signal and the second response signal.

9. The inspection tool according to claim 8, wherein the e-beam source comprises:
    a tip-shaped Schottky emitter configured to emit an electron beam, the tip-shaped Schottky emitter comprising a metallic coating; and
    a magnetic field generator configured to magnetize the metallic coating for spin-polarizing the electron beam.

10. The inspection tool according to claim 9, wherein the metallic coating comprises iron.

11. A lithographic apparatus comprising:
    a support constructed to support a patterning device, the patterning device being capable of imparting a radiation beam with a pattern in its cross-section to form a patterned radiation beam;
    a substrate table constructed to hold a substrate; a projection system configured to project the patterned radiation beam onto a target portion of the substrate; and
    the inspection tool according to claim 8.

12. The inspection tool according to claim 8, wherein the geometric property is a slope of the sample.

13. The inspection tool according to claim 8, wherein the geometric property is a topographic property of the sample.

14. The inspection tool according to claim 8, wherein the e-beam source is configured to generate the e-beam having a first polarization state that is an unpolarized state and a second polarization state that is a polarized state.

15. The inspection tool according to claim 14, wherein a degree of polarization of the polarized state is at least 10%.

16. The inspection tool according to claim 8, wherein the e-beam source is configured to generate the e-beam having a first polarization state that is a polarized state and a second polarization state that is a polarized state.

17. The inspection tool according to claim 16, wherein the first polarization state is a negative polarized state and the second polarization state is a positive polarized state.

18. An inspection tool comprising:
- an e-beam source configured to generate an e-beam having an unpolarized state and an e-beam having a polarized state;
- a beam manipulator configured to direct the electron beam having the unpolarized state and the e-beam having the polarized state onto a sample;
- a detector configured to detect a first response signal caused by interaction of the electron beam having the unpolarized state with the sample and a second response signal caused by interaction of the electron beam having the polarized state with the sample; and
- a processing unit configured to determine a geometric or material property of the sample, based on the first response signal and the second response signal.

19. The inspection tool according to claim 18, wherein a degree of polarization of the polarized state is at least 10%.

20. The inspection tool according to claim 18, wherein the processing unit is configured to determine a geometric property of the sample, based on the first response signal and the second response signal, and wherein the geometric property is a slope of the sample or a topographic property of the sample.

* * * * *